(12) United States Patent
Nakamura et al.

(10) Patent No.: US 11,152,731 B2
(45) Date of Patent: Oct. 19, 2021

(54) CONTACT AND METHOD OF MANUFACTURING SAME

(71) Applicant: Kitagawa Industries Co., Ltd., Aichi (JP)

(72) Inventors: Tatsuya Nakamura, Aichi (JP); Hiroyoshi Ishiguro, Aichi (JP)

(73) Assignee: Kitagawa Industries Co., Ltd., Aichi (JP)

( * ) Notice: Subject to any disclaimer, the term of this patent is extended or adjusted under 35 U.S.C. 154(b) by 0 days.

(21) Appl. No.: 16/982,316

(22) PCT Filed: Mar. 25, 2019

(86) PCT No.: PCT/JP2019/012628
§ 371 (c)(1),
(2) Date: Sep. 18, 2020

(87) PCT Pub. No.: WO2019/189041
PCT Pub. Date: Oct. 3, 2019

(65) Prior Publication Data
US 2021/0013656 A1    Jan. 14, 2021

(30) Foreign Application Priority Data

Mar. 29, 2018   (JP) .............................. JP2018-065285

(51) Int. Cl.
*H01R 13/24* (2006.01)
*H01R 12/57* (2011.01)
*H01R 43/16* (2006.01)

(52) U.S. Cl.
CPC ............. *H01R 13/24* (2013.01); *H01R 12/57* (2013.01); *H01R 43/16* (2013.01)

(58) Field of Classification Search
CPC ........ H01R 13/24; H01R 12/57; H01R 12/51; H01R 12/79; H01R 43/16; H01R 43/205
USPC .......................................................... 439/55
See application file for complete search history.

(56) References Cited

U.S. PATENT DOCUMENTS

| 8,821,198 B2 * | 9/2014 | Harada | ............... H01R 13/2435 439/862 |
| 9,167,698 B2 * | 10/2015 | Konda | ................. H05K 9/0035 |

(Continued)

FOREIGN PATENT DOCUMENTS

| JP | 2011-060694 A | 3/2011 | |
| JP | 2014029809 A * | 2/2014 | ........... H01R 12/737 |

(Continued)

OTHER PUBLICATIONS

International Search Report for the corresponding application No. PCT/JP2019/012628, dated Jun. 11, 2019 with an English translation.

(Continued)

*Primary Examiner* — Peter G Leigh
(74) *Attorney, Agent, or Firm* — Renner, Otto, Boisselle & Sklar, LLP (57) ABSTRACT

The present invention provides a contact capable of suppressing an increase in a DC resistance value for a long period and a method of manufacturing the same. The contact includes a base portion and an elastic contact portion. The elastic contact portion includes a planar portion configured in a planar shape; and a projection portion that is disposed on one surface of the planar portion and protrudes from the one surface. The elastic contact portion is configured to come into pressed contact with the second surface at the projection portion. The projection portion is configured such that a dimensional ratio H/L of the height H to the length L satisfies $0.25 \leq H/L \leq 0.44$, where H is a height in a direction perpendicular to the one surface and L is a length in a direction parallel to the one surface.

6 Claims, 3 Drawing Sheets

(56) References Cited

U.S. PATENT DOCUMENTS

| | | | |
|---|---|---|---|
| 9,281,591 B2 * | 3/2016 | Kurita | H01R 12/724 |
| 9,912,090 B2 * | 3/2018 | Yokota | H01R 13/2407 |
| 10,014,610 B2 * | 7/2018 | Kurita | H01R 12/718 |
| 2009/0170378 A1 * | 7/2009 | Harada | H01R 13/2442 |
| | | | 439/701 |
| 2012/0171909 A1 | 7/2012 | Harada | |
| 2015/0222035 A1 | 8/2015 | Kurita | |
| 2017/0288329 A1 * | 10/2017 | Kurita | H01R 12/718 |
| 2018/0026406 A1 * | 1/2018 | Kim | H01R 12/71 |
| | | | 439/572 |
| 2019/0027843 A1 | 1/2019 | Nakamura et al. | |
| 2019/0190184 A1 | 6/2019 | Nakamura et al. | |
| 2020/0343663 A1 * | 10/2020 | Kurita | H01R 13/24 |

FOREIGN PATENT DOCUMENTS

| | | |
|---|---|---|
| JP | 2014-072317 A | 4/2014 |
| JP | 2017-157437 A | 9/2017 |
| JP | 2017-183094 A | 10/2017 |
| JP | 2017-220426 A | 12/2017 |

OTHER PUBLICATIONS

International Preliminary Report on Patentability for the corresponding application No. PCT/JP2019/012628, dated Mar. 10, 2020 (English translation to be provided once it becomes available).
International Preliminary Report on Patentability for the corresponding application No. PCT/JP2019/012628, dated Oct. 1, 2020 (English translation).

* cited by examiner

CONTACT AND METHOD OF MANUFACTURING SAME

This application is a national phase of International Application No. PCT/JP2019/012628 filed Mar. 25, 2019, which claims priority to Japanese Patent Application No. 2018-065285 filed Mar. 29, 2018 in the Japan Patent Office, which are hereby incorporated herein by reference.

TECHNICAL FIELD

The present disclosure relates to a contact and a method of manufacturing the same.

BACKGROUND ART

A contact used as a counter measure against EMC (electromagnetic compatibility) of an electronic circuit board is known. (e.g., see Patent Document 1). The contact described in Patent Document 1 includes an elastic contact portion having a shape protruding in a direction parallel to a component mounting surface of an electronic circuit board. The elastic contact portion is configured to be movable in the direction parallel to the component mounting surface of the electronic circuit board as the elastic contact portion is elastically deformed.

The elastic contact portion is in pressed contact with a non-contact surface (e.g., a panel surface of the housing) disposed perpendicular to the component mounting surface of the electronic circuit board, at a contact portion located at a tip end in the protruding direction. Thus, the electronic circuit board and the above-described non-contact surface are electrically connected to each other via the contact.

CITATION LIST

Patent Literature

Patent Document 1: Japanese Unexamined Patent Application Publication No. 2014-72317A

SUMMARY OF INVENTION

Technical Problem

However, when the above-described contact is used for a long period in a high-temperature environment (e.g., an engine room of an automobile, or the like) exceeding a normal temperature, a DC resistance value of the contact may increase. When the DC resistance value of the contact increases, the EMC countermeasure effect may be reduced. Therefore, when it is assumed that the contact is used in a high-temperature environment as described above, it is preferable to take measures to suppress the performance degradation of the contact.

In one aspect of the present disclosure, it is desirable to provide a contact capable of suppressing an increase in the DC resistance value for a long period and a method of manufacturing the same.

Solution to Problem

One aspect of the present disclosure is a contact capable of electrically connecting a first surface and a second surface that is disposed perpendicular to the first surface. The contact includes a base portion and an elastic contact portion. The base portion includes a bonding surface soldered to the first surface. The elastic contact portion is configured to elastically deform to come into a pressed contact with the second surface. In addition, the elastic contact portion includes: a planar portion formed in a planar shape; and a projection portion disposed on one surface of the planar portion and protruding from the one surface. The elastic contact portion is configured to come into pressed contact with the second surface at the projection portion. The projection portion is configured such that a dimensional ratio H/L of height H and length L satisfies $0.25 \leq H/L \leq 0.44$, where H is the dimension in a direction perpendicular to the one surface and L is the dimension in a direction parallel to the one surface.

According to the contact configured as described above, it is possible to suppress an increase in the DC resistance value of the contact even when the contact is used for a long period in a high-temperature environment exceeding normal temperature.

Another aspect of the present disclosure is a method of manufacturing a contact capable of electrically connecting a first surface and a second surface that is disposed perpendicular to the first surface. The contact manufactured by the method of manufacturing the same includes: a base portion and an elastic contact portion. The base portion includes a bonding surface soldered to the first surface. The elastic contact portion is configured to elastically deform to come into a pressed contact with the second surface, in addition, the elastic contact portion includes: a planar portion formed in a planar shape; and a projection portion disposed on one surface of the planar portion and protruding from the one surface. The elastic contact portion is configured to come into pressed contact with the second surface at the projection portion. In such a method of manufacturing the contact, in forming the projection portion on the planar portion, the projection portion is formed such that a dimensional ratio H/L of height H and length L satisfies $0.25 \leq H/L \leq 0.44$, where H is a dimension in a direction perpendicular to one surface of the projection portion and L is a dimension in a direction parallel to the one surface of the projection portion.

According to such a method of manufacturing the contact, it is possible to manufacture a contact capable of suppressing an increase in the DC resistance value even when the contact is used for a long period in a high-temperature environment exceeding normal temperature,

DESCRIPTION OF EMBODIMENTS

Figure 2A:
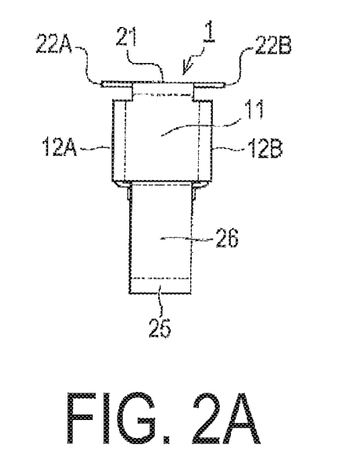
FIG. 2A is a plan view of the contact.
Figure 2B:
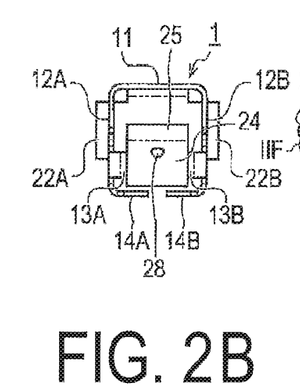
FIG. 2B is a front view of the contact.
Figure 2C:
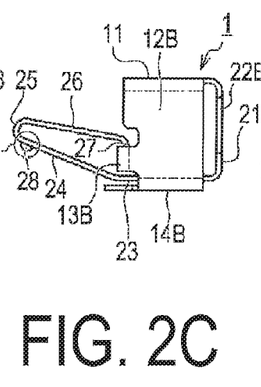
FIG. 2C is a right side view of the contact.
Figure 2D:
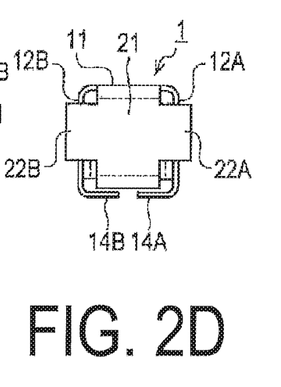
FIG. 2D is a rear view of the contact.
Figure 2E:
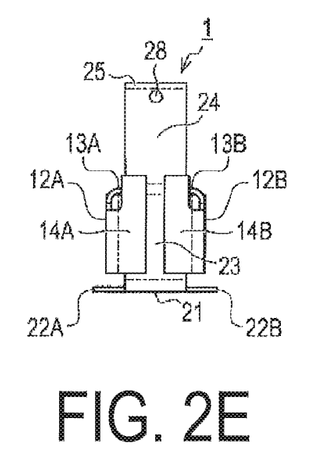
FIG. 2E is a bottom view of the contact.

Next, the above-described contact will be described with reference to exemplary embodiments. in the following description, it is defined herein that the direction in which a portion illustrated in the plan view of FIG. 2A faces is referred to as "up" (corresponding to a z-axis positive direction in the present disclosure), the direction in which a portion illustrated in the front view of FIG. 2B faces is referred to as "front" (corresponding to an x-axis positive direction in the present disclosure), the direction in which a portion illustrated in the right side view of FIG. 2C faces is referred to as "right" (corresponding to a y-axis positive direction in the present disclosure), the direction opposite to "right" is referred to as "left" (corresponding to a y-axis negative direction in the present disclosure), the direction in which a portion illustrated in the rear view of FIG. 2D faces as "rear" (corresponding to an x-axis negative direction in the present disclosure), and the direction in which a portion illustrated in the bottom view of FIG. 2E faces is referred to as "down" (corresponding to a z-axis negative direction in the present disclosure). However, these directions are defined only for the purpose of simply describing the relative positional relationship among the parts constituting a contact 1. Therefore, for example, when the contact 1 is shipped or used or the like, the direction in which the contact 1 is directed is not fixed. The left side view of the contact 1 is symmetrical to the right side view.

Contact Configuration

The contact 1 illustrated in FIGS. 1, 2A, 2B, 2C, 2D, and 2E is a conductive component capable of electrically connecting a first surface (e.g., a component mounting surface of an electronic circuit board) with a second surface (e.g., a surface of a metal panel arranged near the electronic circuit board) disposed perpendicular to the first surface, The contact 1 includes a base portion 3 and an elastic contact portion 5. The base portion 3 and the elastic contact portion 5 are integrally formed of a metal thin plate (in the first embodiment, a thin plate of beryllium copper for a spring that is plated with tin subjected to reflow treatment, thickness: 0.08 mm).

The base portion 3 is a portion where the rigidity is ensured so that the base portion 3 is not substantially deformed even when an expected external force during use of the contact 1 acts thereon. The base portion 3 includes a bonding surface 3A to be soldered to the above-described first surface. The elastic contact portion 5 is a portion. that is elastically deformed when an expected external force during use of the contact 1 acts thereon. The elastic contact portion 5 is elastically deformed in accordance with the contact with the second surface, and applies the elastic force generated at that time onto the second surface, thereby coming into pressed contact with the second surface.

In the present embodiment, the base portion 3 includes: a top plate portion 11 forming an upper surface of the base portion 3; a first vertical wail 12A that curves from a left end of the top plate portion 11 and extends downward; a second vertical wall 12B that curves from a right end of the top plate portion 11 and extends downward; a first hook receiver 13A that curves from a front end of the first vertical wail 12A and extends rightward; a second hook receiver 13B that curves from a front end of the second vertical wall 12B and extends leftward; a first bottom plate portion 14A that curves from a lower end of the first vertical wall 12A and extends rightward; and a second bottom plate portion 14B that curves from a lower end of the second vertical wall 12B and extends leftward. The lower surfaces of the first bottom plate portion 14A and the second bottom plate portion 14B serve as the bonding surface 3A described above.

In the case of the present embodiment, the elastic contact portion 5 includes: a hanging portion 21 that curves from a rear end of the top plate portion 11 and extends downward; a first stopper 22A that protrudes leftward from a left end of the hanging portion 21; a second stopper 22B that protrudes rightward from a right end of the hanging portion 21; a horizontally extending portion 23 that curves from a lower end of the hanging portion 21 and extends forward; a first inclined portion 24 that curves from a front end of the horizontally extending portion 23 and extends obliquely upward and forward; a folding portion 25 that curves upward from a front end of the first inclined portion 24 and folds backward; a second inclined portion 26 that extends obliquely downward and backward from the folding portion 25; and a hook portion 27 that curves from a rear end of the second inclined portion 26 and protrudes downward.

Figure 1:
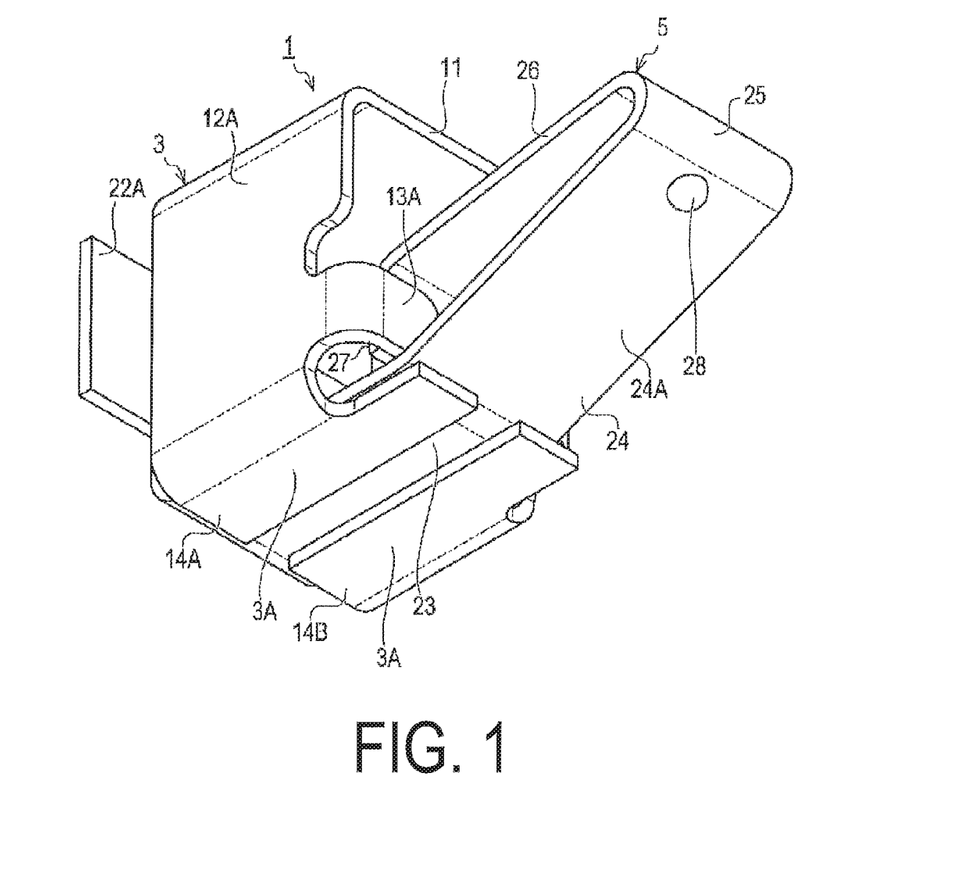
FIG. 1 is a perspective view of a contact.
Figure 2F:
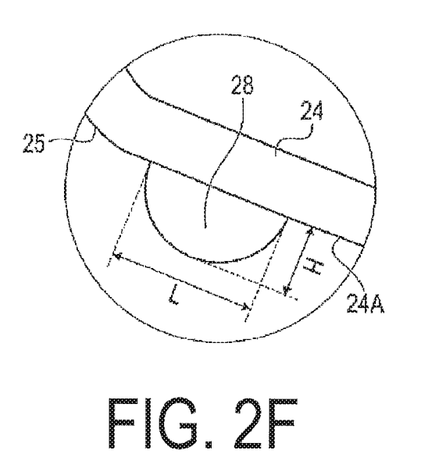
FIG. 2F is an enlarged view of an HF portion illustrated in FIG. 2C.

The first inclined portion 24 constitutes a planar portion in the present disclosure. Hereinafter, the first inclined portion 24 is also referred to as a planar portion 24. The planar portion 24 is provided with a projection portion 28. The projection portion 28 is disposed on and protrudes from a one surface 24A of the planar portion 24. In the case of the present embodiment, the projection portion 28 has a shape in which the tip end portion in the protruding direction corresponds to a part of a sphere. However, the shape of the tip end portion of the projection portion 28 in the protruding direction may be a shape other than the shape corresponding to a part of a sphere and may be, for example, a shape corresponding to a part of a spheroid. In addition, in the vicinity of the boundary between the projection portion 28 and the planar portion 24, a smoothly continuous curved surface may be formed from the projection portion 28 to the planar portion 24.

The horizontally extending portion 23 includes a portion that extends from the hanging portion 21 located backward of the first hook receiver 13A and the second hook receiver 13B, that passes below the first hook receiver 13A and the second hook receiver 13B, and that extends forward of the first hook receiver 13A and the second hook receiver 13B. The second inclined portion 26 includes a portion that extends from the folding portion 25 located forward of the first hook receiver 13A and the second hook receiver 13B, that passes above the first hook receiver 13A and the second hook receiver 13B, and that extends backward of the first hook receiver 13A and the second hook receiver 13B. The hook portion 27 enters a rear side of the first hook receiver 13A and the second hook receiver 13B, The first stopper 22A and the second stopper 22B are displaced forward together with the hanging portion 21 when the hanging portion 21 is elastically deformed and displaced forward and restrict further forward displacement of the hanging portion 21 when the hanging portion is displaced to a position where the hanging portion 21 comes into contact with the first vertical wall 12A and the second vertical wall 12B, The hook portion 27 is hooked on the rear surfaces of the first hook receiver 13A and the second hook. receiver 1313 to restrict the second inclined portion 26 from being displaced forward.

In the horizontally extending portion 23, an upward movable range is defined by the first hook receiver 13A and the second hook receiver 13B, and a downward movable range is defined by the first bottom plate portion 14A and the second bottom plate portion 14B. A movable range of the horizontally extending portion 23 in the left-right direction is defined by the first vertical wall 12A and the second vertical wall 12B. A downward movable range of the second inclined portion 26 is defined by the first hook receiver 13A and the second hook receiver 13B.

Figure 3:
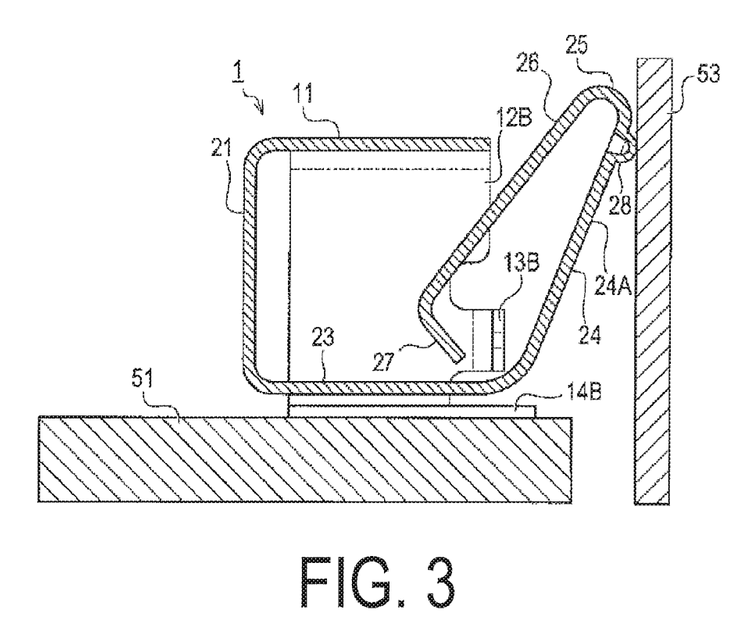
FIG. 3 is a longitudinal sectional view illustrating a state in which the contact is used.

For example, as illustrated in FIG. 3, the contact 1 configured as described above is surface-mounted on the component mounting surface of an electronic circuit board 51 and is arranged at a predetermined location together with the electronic circuit board 51. When the electronic circuit board 51 is arranged at a predetermined location, one of the electronic circuit board 51 and a metal panel 53 is moved relative to the other such that the surface of the metal panel 53 slides in a direction perpendicular to the component mounting surface of the electronic circuit board 51. As a result, the contact 1 can be disposed at a desired position. At this time, for example, the elastic contact portion 5 of the contact 1 is brought into contact with the surface of the metal panel 53 arranged in the vicinity of the electronic circuit board 51, at the projection portion 28 to electrically connect the electronic circuit board 51 and the metal panel 53.

The projection portion 28 is configured such that a dimensional ratio H/L of height H and length L satisfies 0.25≤H/L≤0.492, where H (see FIG. 2F) is the dimension in a direction perpendicular to the one surface 24A of the planar portion 24 and where L (see FIG. 2F) is the dimension in a direction parallel to the one surface 24A of the planar portion 24. In addition, in the case of the present embodiment, the projection portion 28 is configured such that the height H satisfies 0.089 mm≤H≤0.296 mm and the length L satisfies 0.226 mm≤L≤0.788 mm.

By forming the projection portion 28 in a shape that satisfies the above-described conditions, it is possible to suppress an increase in the DC resistance value of the contact even when the contact is used for a long period in a high-temperature environment exceeding normal temperature. This effect has been confirmed by the inventors of the present case as a result of repeating many experiments by changing the dimensions of the projection portion 28. The inventors of the present case performed a heat cycle test as described below in order to confirm how much the increase in the DC resistance value can be suppressed by changing the dimensions of the projection portion 28. First, the following structures are prepared as test objects. The contact 1 is surface-mounted on a printed circuit board. A gold-plated copper plate is disposed at a position perpendicular to the printed circuit board, and the contact 1 is disposed so as to come into pressed contact with the gold-plated copper plate. The relative positions of the contact 1 and the gold-plated copper plate are set so that the elastic contact portion 5 of the contact 1 is compressed by 10%. The printed circuit board and the gold-plated copper plate are positioned via a spacer or the like, and necessary portions are fixed by a fixing tool such as a screw or the like so that the relative positions thereof are not shifted.

The test object configured as described above is placed in a chamber of an environmental tester (model name: SH-242, available from ESPEC CORP,). The temperature in the chamber is periodically changed between −40° C. and 125° C. More specifically, the temperature in the chamber is raised to 125° C. and then maintained at 125° C. for 2 hours. Thereafter, the temperature in the chamber is lowered to −40° C. for 1 hour and then kept at −40° C. for 2 hours.

Thereafter, the temperature in the chamber is raised to 125° C. for 1 hour, and thereafter the temperature in the chamber is changed in the above-described cycle, After the above-described periodic treatment is performed for 167 cycles, the resistance value of the contact 1 is measured by a resistance meter (mΩ HiTester), The test results are shown in Table 1 below.

TABLE 1

| No | H(mm) | L(mm) | H/L | Resistance value (mΩ) |
|---|---|---|---|---|
| 1 | 0.023 | 0.460 | 0.05 | 827 |
| 2 | 0.025 | 0.417 | 0.06 | 414 |
| 3 | 0.026 | 0.413 | 0.063 | 329 |
| 4 | 0.034 | 0.425 | 0.08 | 231 |

TABLE 1-continued

| No | H(mm) | L(mm) | H/L | Resistance value (mΩ) |
|---|---|---|---|---|
| 5 | 0.036 | 0.434 | 0.083 | 247 |
| 6 | 0.036 | 0.419 | 0.086 | 198 |
| 7 | 0.044 | 0.440 | 0.1 | 232 |
| 8 | 0.046 | 0.414 | 0.111 | 221 |
| 9 | 0.047 | 0.392 | 0.12 | 597 |
| 10 | 0.051 | 0.408 | 0.125 | 190 |
| 11 | 0.053 | 0.417 | 0.127 | 413 |
| 12 | 0.059 | 0.421 | 0.14 | 111 |
| 13 | 0.060 | 0.420 | 0.143 | 106 |
| 14 | 0.064 | 0.427 | 0.15 | 178 |
| 15 | 0.197 | 0.788 | 0.25 | 24 |
| 16 | 0.259 | 0.778 | 0.333 | 22 |
| 17 | 0.089 | 0.237 | 0.375 | 12 |
| 18 | 0.091 | 0.234 | 0.389 | 11 |
| 19 | 0.095 | 0.238 | 0.4 | 12 |
| 20 | 0.097 | 0.226 | 0.429 | 11 |
| 21 | 0.103 | 0.234 | 0.44 | 11 |
| 22 | 0.064 | 0.310 | 0.206 | 383 |
| 23 | 0.296 | 0.713 | 0.415 | 21 |
| 24 | 0.201 | 0.858 | 0.234 | 627 |
| 25 | 0.381 | 0.710 | 0.537 | 355 |

In Table 1, it was determined that the contact (Nos. 15 to 21, 23) having a resistance value of 30 mΩ or less can suppress an increase in the DC resistance value of the contact even when used for a long period in a high-temperature environment exceeding normal temperature, Looking at the contact Nos. 15 to 21 and 23, it can be seen that the height H of the projection portion 28 is preferable when satisfying 0.089 mm≤H≤0.296 mm.

In the case of the contact (Nos. 1 to 14, 22) in which the height H of the projection portion 28 is less than 0.089 nm, the resistance value increases to 106 to 827 mΩ. From this, it can he seen that when the height H of the projection portion 28 is excessively low, the projection portion 28 does not function effectively. On the other hand, in the case of the contact (No. 25) in which the height H of the projection portion 28 exceeds 0.296 mm, the resistance value increases to 355 mΩ. From this, it can be seen that even when the height H of the projection portion 28 is excessively high, the projection portion 28 does not function effectively. However, even in a contact in which the height H of the projection portion 28 satisfies 0.089 mm≤H≤0.296 mm, there is an example in which the resistance value increases to 627 mΩ (No. 24).

Therefore, the inventors of the present case have considered that the desired effect is not necessarily obtained only by optimizing the height H of the projection portion 28 and have made further studies. In the studies, it was found that the contact No. 24 had a larger value of the length L than the other contacts. From this fact, in the contact of No. 24, although the height H of the projection portion 28 is appropriately high, the value of the length L is large, so the tip end of the projection portion 28 is not so sharp, and it is presumed that the function of the projection portion 28 deteriorates due to this. Based on the above-described estimation results, the inventors of the present case have focused on the dimensional ratio H/L between the height H and the length L of the projection portion 28.

Looking at the contact of Nos. 15 to 21, 23, it can be seen that it is preferable that the dimensional ratio H/L of the projection portion 28 satisfies 0.25≤H/L≤0.44. In the case of the contact (Nos. 1 to 14, 22, 24) in which the dimensional ratio H/L of the projection portion 28 is less than 0.25, the resistance value increases to 106 to 827 mΩ. From this, it can be seen that when the dimensional ratio H/L of the projection portion 28 is excessively small, the projection portion 28 does not function effectively. On the other hand, in the case of the contact (No. 25) in which the dimensional ratio H/L of the projection portion 28 exceeds 0.44, the resistance value increases to 355 mΩ. From this, it can be seen that even when the dimensional ratio H/L of the projection portion 28 is excessively large, the projection portion 28 does not effectively function.

In the case where the characteristic of the projection portion 28 is specified by the dimensional ratio H/L, unlike the case where the characteristic is specified by the height H, when 0.25≤H/L≤0.44 is satisfied, a desired effect can be obtained without exception. Therefore, in order to suppress an increase in the resistance value of the contact, it is presumed that optimization of the dimensional ratio H/L of the projection portion 28 becomes an important factor.

Effects

As described. above, according to the contact 1, it is possible to suppress an increase in the DC resistance value of the contact even when the contact 1 is used for a long period in a high-temperature environment exceeding normal temperature.

Other Embodiments

Although the contact and the method of manufacturing the same have been described with reference to exemplary embodiments, the above-described embodiments are merely examples of one aspect of the present disclosure. That is, the present disclosure is not limited to the above-described exemplary embodiments and can be implemented in various forms without departing from the technical concept of the present disclosure.

For example, in addition to the above-described contact and the method of manufacturing the same, the present disclosure can be implemented in various forms such as an electronic circuit board on which the above-described contact is mounted, and a component supply body (e.g., a carrier tape or a housing tray) in which the above-described contact is housed.

Supplementary Description.

Additionally, as is apparent from the exemplary embodiments described above, the contact of the present disclosure may further include the following configurations.

In one aspect of the present disclosure, the projection portion may be configured such that the height H satisfies 0.089 nm≤H≤0.296 mm and the length L satisfies 0.226 mm≤L≤0.788 mm.

In one aspect of the present disclosure, the base portion may include: a top plate portion, a first vertical wall, a second vertical wall, a first bottom plate portion, and a second bottom plate portion. When a three-dimensional orthogonal coordinate system is defined in which the x-axis and the y-axis are parallel to the bonding surface, the z-axis is perpendicular to the bonding surface, and the bonding surface is oriented in the z-axis negative direction, the top plate portion constitutes a surface of the base portion oriented in the z-axis positive direction. The first vertical wall includes at least a portion that curves from an end portion of the top plate portion in the y-axis negative direction and extends in the z-axis negative direction. The second vertical wall includes at least a portion that curves from an end portion of the top plate portion in the y-axis positive direction and extends in the z-axis negative direction. The first bottom plate portion includes at least a portion that curves from an end portion of the first vertical wall in the z-axis negative direction and extends in the y-axis positive direction. The second bottom plate portion includes at least a portion that curves from an end portion of the second vertical wall in the z-axis negative direction and extends in the y-axis negative direction. The bonding surface is composed of surfaces facing to the z-axis negative direction of the first bottom plate portion and the second bottom plate portion. The elastic contact portion may include: a hanging portion, a horizontally extending portion, a first inclined portion, a folding portion, and a second inclined portion. The hanging portion includes at least a portion that curves from an end portion of the top plate portion in the x-axis negative direction and extends in the z-axis negative direction. The horizontally extending portion includes at least a portion that curves from an end portion of the hanging portion in the z-axis negative direction and extends in the x-axis positive direction. The first inclined portion includes at least a portion that curves from an end portion of the horizontally extending portion in the x-axis positive direction and extends obliquely in the x-axis positive direction and the z-axis positive direction. The folding portion includes at least a portion that curves from. the end portion of the first inclined portion in the x-axis positive direction toward the z-axis positive direction and folds back toward the x-axis negative direction. The second inclined portion includes at least a portion extending obliquely from the folding portion in the x-axis negative direction and the z-axis negative direction. The planar portion is composed of the first inclined portion.

In one aspect of the present disclosure, the base portion may include a first hook receiver and a second hook receiver. The first hook receiver includes at least a portion that curves from an end portion of the first vertical wall in the x-axis positive direction and extends in the y-axis positive direction. The second hook receiver includes at least a portion that curves from an end portion of the second vertical wall in the x-axis positive direction and extends in the y-axis negative direction. The elastic contact portion includes a hook portion that curves from an end portion of the second inclined portion in the x-axis negative direction and protrudes in the z-axis negative direction. The horizontally extending portion, extends from the hanging portion located in the x-axis negative direction relative to the first hook receiver and the second hook receiver, passes through a position located in the z-axis negative direction relative to the first hook receiver and the second hook receiver, and extends in the x-axis positive direction relative to the first hook receiver and the second hook receiver. The second inclined portion extends from the folding portion located in the x-axis positive direction relative to the first hook receiver and the second hook receiver, passes through a position located in the z-axis positive direction relative to the first hook receiver and the second hook receiver, and extends in the x-axis negative direction relative to the first hook receiver and the second hook receiver. The hook portion is configured to enter a position on the x-axis negative direction side of the first hook receiver and the second hook receiver.

REFERENCE SIGNS LIST

1 Contact
3 Base portion
3A Bonding surface
5 Elastic contact portion
11 Top plate portion
12A First vertical wall
12B Second vertical wall 13A First hook receiver
13B Second hook receiver
14A First bottom plate portion
14B Second bottom plate portion
21 Hanging portion
22A First stopper
22B Second stopper
23 Horizontally extending portion
24 First inclined portion (Planar portion)
24A One surface of planar portion
25 Folding portion
26 Second inclined portion
27 Hook portion
28 Projection portion

The invention claimed is:

1. A contact capable of electrically connecting a first surface and a second surface that is disposed perpendicular to the first surface, the contact comprising:
a base portion including a bonding surface soldered to the first surface; and
an elastic contact portion configured to elastically deform to come into pressed contact with the second surface,
wherein the elastic contact portion includes:
a planar portion configured to be in a planar shape; and
a projection portion that is disposed on one surface of the planar portion and protrudes from the one surface,
the elastic contact portion is configured to come into pressed contact with the second surface at the projection portion,
the projection portion is configured such that a dimensional ratio H/L of height H and length L satisfies 0.25 H/L 0.44, where H is a dimension in a direction perpendicular to the one surface and L is a dimension in a direction parallel to the one surface,
the projection portion is configured such that the height H satisfies 0.089 mm≤H≤0.296 mm and the length L satisfies 0.226 mm≤L≤0.788 mm, and
after a processing in which temperature periodically changes between −40° C. and 125° C. is performed for 167 cycles by a heat cycle test, a measured DC resistance value is 30 mΩ or less.

2. The contact according to claim 1,
wherein when a three-dimensional orthogonal coordinate system is defined in which an x-axis and a y-axis are parallel to the bonding surface, a z-axis is perpendicular to the bonding surface, and the bonding surface is oriented in a z-axis negative direction,
the base portion includes:
a top plate portion that constitutes a surface of the base portion oriented in a z-axis positive direction;
a first vertical wall including at least a portion that curves from an end portion of the top plate portion in a y-axis negative direction and extends in the z-axis negative direction;
a second vertical wall including at least a portion that curves from an end portion of the top plate portion in a y-axis positive direction and extends in the z-axis negative direction;
a first bottom plate portion including at least a portion that curves from an end portion of the first vertical wall in the z-axis negative direction and extends in the y-axis positive direction; and
a second bottom plate portion including at least a portion that curves from an end portion of the second vertical wall in the z-axis negative direction and extends in the y-axis negative direction,
the bonding surface is formed by surfaces facing to the z-axis negative direction of the first bottom plate portion and the second bottom plate portion, the elastic contact portion includes:
a hanging portion including at least a portion that curves from an end portion of the top plate portion in an x-axis negative direction and extends in the z-axis negative direction;
a horizontally extending portion including at least a portion that curves from an end portion of the hanging portion in the z-axis negative direction and extends in an x-axis positive direction;
a first inclined portion including at least a portion that curves from an end portion of the horizontally extending portion in the x-axis positive direction and extends obliquely in the x-axis positive direction and the z-axis positive direction;
a folding portion including at least a portion that curves from an end portion of the first inclined portion in the x-axis positive direction toward the z-axis positive direction and folds back toward the x-axis negative direction; and
a second inclined portion including at least a portion that extends obliquely from the folding portion in the x-axis negative direction and the z-axis negative direction, and
the planar portion is composed of the first inclined portion.

3. The contact according to claim 2,
wherein the base portion includes:
a first hook receiver including at least a portion that curves from an end portion of the first vertical wall in the x-axis positive direction and extends in the y-axis positive direction; and
a second hook receiver including at least a portion that curves from an end portion of the second vertical wall in the x-axis positive direction and extends in the y-axis negative direction,
the elastic contact portion includes
a hook portion that curves from an end portion of the second inclined portion in the x-axis negative direction and protrudes in the z-axis negative direction,
the horizontally extending portion extends from the hanging portion located in the x-axis negative direction relative to the first hook receiver and the second hook receiver, passes through a position located in the z-axis negative direction relative to the first hook receiver and the second hook receiver, and extends in the x-axis positive direction relative to the first hook receiver and the second hook receiver,
the second inclined portion extends from the folding portion located in the x-axis positive direction relative to the first hook receiver and the second hook receiver, passes through a position located in the z-axis positive direction relative to the first hook receiver and the second hook receiver, and extends in the x-axis negative direction relative to the first hook receiver and the second hook receiver, and
the hook portion is configured to enter a position on the x-axis negative direction side of the first hook receiver and the second hook receiver.

4. The contact according to claim 1,
wherein the processing in which the temperature periodically changes between −40° C. and 125° C. is performed according to a predetermined heat cycle test, and the predetermined heat cycle test is performed by:

preparing a test object including the first surface, the second surface, and the contact, in the test object, surface-mounting the contact on the first surface, disposing the second surface to be perpendicular to the first surface, disposing the contact to be in pressure contact with the second surface, setting a relative position between the contact and the first surface such that the elastic contact portion of the contact is compressed by 10%, and configuring the first surface and the second surface to be positioned via a spacer and to be fixed by a fixture so that the relative position is not to be displaced from each other;

placing the test object in a chamber of an environmental tester; and changing the temperature in the chamber by repeating the steps of:

increasing the temperature in the chamber to 125° C., then maintaining the temperature in the chamber at 125° C. for 2 hours, then decreasing the temperature in the chamber to −40° C. for 1 hour, then maintaining the temperature in the chamber at −40° C. for 2 hours, then increasing the temperature in the chamber to 125° C. for 1 hour, in this order.

5. A method of manufacturing a contact capable of electrically connecting a first surface and a second surface that is disposed perpendicular to the first surface, wherein the contact includes:

a base portion including a bonding surface soldered to the first surface; and an elastic contact portion configured to elastically deform to come into pressed contact with the second surface, the elastic contact portion includes:

a planar portion configured to be in a planar shape; and a projection portion that is disposed on one surface of the planar portion and protrudes from the one surface, the elastic contact portion is configured to come into pressed contact with the second surface at the projection portion, in forming the projection portion on the planar portion, the projection portion is formed such that a dimensional ratio H/L of height H and length L satisfies $0.25 \leq H/L \leq 0.44$, where H is a dimension in a direction perpendicular to the one surface of the projection portion and L is a dimension in a direction parallel to the one surface of the projection portion, the projection portion is configured such that the height H satisfies $0.089 \text{ mm} \leq H \leq 0.296 \text{ mm}$ and the length L satisfies $0.226 \text{ mm} \leq L \leq 0.788 \text{ mm}$, and after a processing in which temperature periodically changes between −40° C. and 125° C. is performed for 167 cycles by a heat cycle test, a measured DC resistance value is 30 mΩ or less.

6. The method of manufacturing a contact, according to claim 5, wherein the processing in which the temperature periodically changes between −40° C. and 125° C. is performed according to a predetermined heat cycle test, and the predetermined heat cycle test is performed by:

preparing a test object including the first surface, the second surface, and the contact, in the test object, surface-mounting the contact on the first surface, disposing the second surface to be perpendicular to the first surface, disposing the contact to be in pressure contact with the second surface, setting a relative position between the contact and the first surface such that the elastic contact portion of the contact is compressed by 10%, and configuring the first surface and the second surface to be positioned via a spacer and to be fixed by a fixture so that the relative position is not to be displaced from each other;

placing the test object in a chamber of an environmental tester; and changing the temperature in the chamber by repeating the steps of:

increasing the temperature in the chamber to 125° C., then maintaining the temperature in the chamber at 125° C. for 2 hours, then decreasing the temperature in the chamber to −40° C. for 1 hour, then maintaining the temperature in the chamber at −40° C. for 2 hours, then increasing the temperature in the chamber to 125° C. for 1 hour, in this order.

* * * * *